(12) United States Patent
Boulharts et al.

(10) Patent No.: US 10,476,355 B2
(45) Date of Patent: Nov. 12, 2019

(54) METHOD OF CONTROLLING A CONVERTER CONNECTED TO AN ELECTRIC MACHINE

(71) Applicant: Schneider Toshiba Inverter Europe SAS, Pacy sur Eure (FR)

(72) Inventors: Hocine Boulharts, Triel sur Seine (FR); Rudolf Fehringer, Vienna (AT)

(73) Assignee: Schneider Toshiba Inverter Europe SAS, Pacy sur Eure (FR)

( * ) Notice: Subject to any disclaimer, the term of this patent is extended or adjusted under 35 U.S.C. 154(b) by 0 days.

(21) Appl. No.: 16/266,918

(22) Filed: Feb. 4, 2019

(65) Prior Publication Data

US 2019/0252951 A1    Aug. 15, 2019

(30) Foreign Application Priority Data

Feb. 14, 2018 (FR) ..................... 18 51232

(51) Int. Cl.
*H02M 7/515* (2007.01)
*H02K 11/26* (2016.01)
(Continued)

(52) U.S. Cl.
CPC ............ *H02K 11/26* (2016.01); *H02K 11/30* (2016.01); *H02M 7/515* (2013.01); *H03H 7/1775* (2013.01)

(58) Field of Classification Search
CPC ......... H02K 11/26; H02K 11/30; H02M 7/42; H02M 7/44; H02M 7/515; H02M 7/521;
(Continued)

(56) References Cited

U.S. PATENT DOCUMENTS 9,812,971 B1 * 11/2017 Tschirhart ......... H02M 3/33507
2007/0285028 A1 * 12/2007 Tsinker .................. H05B 39/02
315/224

(Continued)

OTHER PUBLICATIONS

Korhonen, J., et al., "Control of an Inverter Output Active du/dt Filtering Method", 35th Annual Conference of IEEE Industrial Electronics, Nov. 3-5, 2009, Porto, Portugal, 6 pages.

(Continued)

*Primary Examiner* — Adolf D Berhane
(74) *Attorney, Agent, or Firm* — Locke Lord LLP

(57) ABSTRACT

The invention relates to a method for controlling a converter connected to an electric machine by a cable (Cx) via a filter (F), said method consisting in determining at least one sequence of a plurality of voltage pulses forming a square wave signal to be applied to each conductor so as to minimize an overvoltage level, said sequence comprising a number 2N of successive pulses, N being greater than or equal to 1, each pulse being defined by a distinct rank n, said sequence being generated such that each increasing voltage pulse of rank n exhibits a pulse width that is identical to that of a decreasing voltage pulse of rank equal to 2N+1−n, and the method includes the following steps in particular:
    determining the number of successive pulses of said sequence;
    determining the width of each pulse of the sequence made suitable for minimizing the overvoltage level across the terminals of the electric machine (M).

12 Claims, 5 Drawing Sheets

(51) Int. Cl.
*H03H 7/01* (2006.01)
*H02K 11/30* (2016.01)

(58) Field of Classification Search
CPC ......... H02M 7/523; H02M 2007/4803; H02M 2007/4815; H03H 7/1775
See application file for complete search history.

(56) References Cited

U.S. PATENT DOCUMENTS

| | | | |
|---|---|---|---|
| 2010/0225308 A1* | 9/2010 | Kurumado | G01D 5/2451 324/207.25 |
| 2013/0170268 A1* | 7/2013 | Yamada | H02P 27/08 363/131 |
| 2017/0047862 A1* | 2/2017 | Luo | H02J 3/38 |
| 2017/0168115 A1* | 6/2017 | Lung | G01R 31/3278 |
| 2017/0302199 A1* | 10/2017 | Boulharts | H02P 5/74 |
| 2018/0375336 A1* | 12/2018 | Bhowmik | H02J 3/00 |

OTHER PUBLICATIONS

Strom, J.P., et al., "Adtive du/dt Filtering for Variable-Speed AC Drives", 13th European Conference on Power Electronics and Applications, Sep. 8-10, 2009, Barcelona, Spain, 10 pages.

Tyster, J., et al., "High-speed gate drive scheme for three-phase inverter with twenty nanosecond minimum gate drive pulse", 13th European Conference on Power Electronics and Applications, Sep. 8-10, 2009, Barcelona, Spain, 10 pages.

Search Report and Written Opinion issued by the French Patent Office for French Patent Application No. 1851232 dated Sep. 20, 2018, 8 pages.

* cited by examiner

METHOD OF CONTROLLING A CONVERTER CONNECTED TO AN ELECTRIC MACHINE

This application claims priority to and benefit from French Patent Application No. 1851232, filed on Feb. 14, 2018. The entire contents of the aforementioned patent application are expressly incorporated by reference herein.

TECHNICAL FIELD OF THE INVENTION

The present invention relates to a method for controlling a converter connected to an electric machine. The invention also relates to a control system suitable for implementing the method.

PRIOR ART

A DC-to-AC converter, also referred to as an inverter, is intended to control an electric machine. It is known that large variations in voltage (dv/dt) may occur when switching the transistors of the inverter, which may give rise to leakage currents, losses in the inverter and overvoltages in the winding of the stator of the electric machine, in particular if the machine is connected to the converter by a long cable.

To overcome these problems, one solution consists in placing, at the output of the inverter, a dv/dt filter including a plurality of passive components, i.e. an inductor, a capacitor and a damping resistor. However, this solution requires the use of a resistor that dissipates power.

Another solution consists in using a converter with at least three voltage levels. It is then a question of generating a first voltage pulse that reaches half-voltage (E/2) and another pulse having an amplitude of E/2 in order to reach the voltage E. The second pulse is generated with a delay of twice the propagation time of the cable. However, such a sequence cannot easily be implemented using a two-level converter.

To monitor the variations in voltage (dv/dt) on each switching operation in a two-level converter, the publication by Juhamatii Korhonen, Juha-Pekka Ström, Juho Tyser, Pertti Silventoinen, Hannu Sarén and Kimmo Rauma, *"Control of an inverter output active du/dt filtering method"* in *Proceedings of the 35$^{th}$ Annual Conference of the IEEE Industrial Electronics Society*, IECON 2009 proposes generating a sequence of a plurality of successive pulses on each switching transition of a power switch of the inverter. This solution makes it possible to avoid using the damping resistor. However, this solution is not always satisfactory when it comes to obtaining the desired voltage at the input of the cable and hence the desired voltage at the output of the cable, i.e. across the terminals of the electric machine.

The objective of the invention is therefore to provide a method for optimizing the control applied to a converter that makes it possible to limit the overvoltages across the terminals of the electric machine.

The solution of the invention could also be suitable for minimizing the losses due to switching in the inverter and/or for minimizing the variation in the voltage at the input of the cable.

DISCLOSURE OF THE INVENTION

This objective is achieved by means of a method for controlling a converter connected to an electric machine by a cable via a filter, said cable comprising at least two conductors and exhibiting an impedance and said filter being an LC filter and comprising at least one inductor and one capacitor for each conductor of the cable, said converter comprising at least two switching arms each comprising at least two power switches that are switched so as to chop a DC voltage having a value E in order to deliver at least two voltage levels, the controlling of a switching arm making it possible to generate voltage pulses on the output phase that is connected thereto, a voltage pulse potentially being an increasing voltage pulse and including a rising vertical voltage edge or a decreasing voltage pulse and including a falling vertical voltage edge, said method consisting in determining at least one sequence of a plurality of voltage pulses forming a square wave signal to be applied to each conductor on each switching transition of the two power switches of one and the same switching arm so as to minimize an overvoltage level across the terminals of the electric machine, said sequence comprising a number 2N of successive pulses, N being greater than or equal to 1, each pulse being defined by a distinct rank n, said sequence being generated such that each increasing voltage pulse of rank n exhibits a pulse width that is identical to that of a decreasing voltage pulse of rank equal to 2N+1−n, and the method includes the following steps:

determining the number of successive pulses of said sequence;

determining the width of each pulse of the sequence made suitable for minimizing the overvoltage level across the terminals of the electric machine (M) while satisfying the following relation:

$$t_N = t_p + t_r/2$$

where:
$t_N$ corresponds to an instant in time of the end of the pulse of rank N;
$t_p$ corresponds to the propagation time of the cable;
$t_r$ corresponds to the rise time for the voltage present at the input of the cable to reach 50% of said value E of the DC voltage.

According to one particularity, the method includes a step of determining the overvoltage level on the basis of the following relation:

$$\text{Int}_{Vo} = \lim_{T \to \infty} \frac{1}{T} \int_0^T (Vo(L, C, Zc, t_p, t_1, t_2, t_3, \ldots t_{2N}))^2 dt$$

where:
$\text{Int}_{Vo}$ corresponds to said overvoltage level resulting from calculating the integral of the voltage Vo across the terminals of the electric machine;
L corresponds to the inductance of the inductor of the filter;
C corresponds to the capacitance of the capacitor of the filter;
Zc corresponds to the characteristic impedance of the cable.

According to another particularity, the method includes at least one step of comparing the overvoltage level determined for said pulse sequence with a threshold value.

According to another particularity, the method includes a step of increasing the number of pulses in the sequence for as long as the obtained overvoltage level exceeds said threshold value.

According to another particularity, the method includes a step of determining the rise time for the voltage at the input of the cable to reach 50% of said value E of the DC voltage on the basis of the following relation:

$$t_r = f(L, C, Z_c, d_1, d_2 \ldots d_N)$$

where:
- L corresponds to the inductance of the inductor of the filter;
- C corresponds to the capacitance of the capacitor of the filter;
- Zc corresponds to the characteristic impedance of the cable;
- $d_1, d_2 \ldots d_N$ correspond to the width of each pulse of rank n of said sequence of pulses.

According to another particularity, the method includes a step of entering or of identifying the following parameters:
- L, corresponding to the inductance of the inductor of the filter;
- C, corresponding to the capacitance of the capacitor of the filter;
- Zc, corresponding to the characteristic impedance of the cable;
- tp, corresponding to the propagation time of the cable.

The invention also relates to a system for controlling a converter connected to an electric machine by a cable via a filter, said cable comprising at least two conductors and exhibiting an impedance and said filter being an LC filter and comprising at least one inductor and one capacitor for each conductor of the cable, said converter comprising at least two switching arms each comprising at least two power switches that are switched so as to chop a DC voltage having a value E in order to deliver at least two voltage levels, the controlling of a switching arm making it possible to generate voltage pulses on the output phase that is connected thereto, a voltage pulse potentially being an increasing voltage pulse and including a rising vertical voltage edge or being a decreasing voltage pulse and including a falling vertical voltage edge, said system being suitable for determining at least one sequence of a plurality of voltage pulses forming a square wave signal to be applied to each conductor on each switching transition of the two power switches of one and the same switching arm so as to minimize an overvoltage level across the terminals of the electric machine (M), said sequence comprising a number 2N of successive pulses, N being greater than or equal to 1, each pulse being defined by a distinct rank n, said sequence being generated such that each increasing voltage pulse of rank n exhibits a pulse width that is identical to that of a decreasing voltage pulse of rank equal to 2N+1−n, and the system is also suitable for:
- determining the number of successive pulses of said sequence;
- determining the width of each pulse of the sequence made suitable for minimizing the overvoltage level across the terminals of the electric machine while satisfying the following relation:

$$t_N = t_p + t_r/2$$

where:
- $t_N$ corresponds to an instant in time of the end of the pulse of rank N;
- $t_p$ corresponds to the propagation time of the cable;
- $t_r$ corresponds to the rise time for the voltage (Vi) present at the input of the cable to reach 50% of said value E of the DC voltage.

According to one particularity, the system is suitable for determining an overvoltage level on the basis of the following relation:

$$\text{Int}_{V_o} = \lim_{T \to \infty} \frac{1}{T} \int_0^T (V_o(L, C, Z_c, t_p, t_1, t_2, t_3, \ldots t_{2N}))^2 dt$$

where:
- $\text{Int}_{V_o}$ corresponds to said overvoltage level resulting from calculating the integral of the voltage Vo across the terminals of the electric machine;
- L corresponds to the inductance of the inductor of the filter;
- C corresponds to the capacitance of the capacitor of the filter;
- Zc corresponds to the characteristic impedance of the cable.

According to another particularity, the system is suitable for comparing said overvoltage level determined for said pulse sequence with a threshold value.

According to another particularity, the system is suitable for increasing the number of pulses in the sequence for as long as the obtained overvoltage level exceeds said threshold value.

According to another particularity, the system is suitable for determining the rise time for the voltage (Vi) at the input of the cable to reach 50% of said value E of the DC voltage on the basis of the following relation:

$$t_r = f(L, C, Z_c, d_1, d_2 \ldots d_N)$$

where:
- L corresponds to the inductance of the inductor of the filter;
- C corresponds to the capacitance of the capacitor of the filter;
- Zc corresponds to the characteristic impedance of the cable;
- $d_1, d_2 \ldots d_N$ correspond to the width of each pulse of rank n of said sequence of pulses.

According to another particularity, the system includes a module for entering or for identifying the following parameters:
- L, corresponding to the inductance of the inductor of the filter;
- C, corresponding to the capacitance of the capacitor of the filter;
- Zc, corresponding to the characteristic impedance of the cable;
- tp, corresponding to the propagation time of the cable.

The solution described in the prior publication cited above implements pulses that are always of the same width. To achieve this, it relies on the characteristics of the filter (the value of the inductance and that of the capacitance of the capacitor). Since the cable is connected in parallel to the capacitor of the resonant filter, the input impedance of the cable (Zi) is parallel to the capacitor of the filter.

In this situation, a first solution is to choose a capacitor that exhibits a very large capacitance, making it possible to impose an impedance that is low with respect to the impedance of the cable and thus to disregard the impedance of the cable. This makes it easier to determine the widths of the pulses for a chosen pattern (pulse number and pulse type) with knowledge of the values of the inductance and of the capacitance of the capacitor only. The generated variation in voltage (dv/dt) is set at four times the value of the propagation time ($t_p$) of the cable in order to limit the overvoltage at the end of the cable and hence across the terminals of the electric machine. However, this solution has certain limitations:

1) beyond a given cable length, the input impedance Zi thereof becomes non-negligible (Zi being an impedance that is dependent on the propagation time $t_p$);

2) the capacitance value of the capacitor of the filter becomes very high, entailing a very large peak current, larger than that which can be brought about by one cable alone. The losses in the power switches of the converter become very high.

Another approach consists in taking elements of the cable ($t_p$, Zc) (Zc being the characteristic impedance of the cable, equivalent to a resistance) and of the LC resonant filter into account. The capacitance value of the capacitor of the resonant filter may be chosen independently of the cable. The impedance of the capacitor of the filter may be higher than the input impedance Zi of the cable connected to the filter. The peak current is decreased and as a result the losses generated in the power components of the converter decrease with respect to the solutions presented above. However, this freedom as to the choice of the capacitance value of the capacitor is possible on the condition that an optimized particular sequence of pulses is applied. It is therefore a question of the optimal sequence that is generated by the method of the invention.

BRIEF DESCRIPTION OF THE FIGURES

Other features and advantages will become apparent in the following detailed description provided with reference to the appended drawings, in which.

DETAILED DESCRIPTION OF AT LEAST ONE EMBODIMENT

The invention is applicable to a control setup comprising in particular a converter connected to an electric machine. Nonlimitingly, the electric machine may be an electric motor.

The converter is a DC-to-AC converter, i.e. it is an inverter.

This inverter 200 may be incorporated within a variable speed drive.

The inverter 200 receives a DC voltage E as input. Nonlimitingly, the DC voltage is delivered by a DC bus that is connected to a rectifier stage located at the input and intended to convert an AC voltage supplied by the electrical network into a DC voltage. The DC bus includes two power supply lines and bus capacitors Cb1, Cb2 that are connected between the two power supply lines in order to stabilize the DC voltage.

Figure 1:
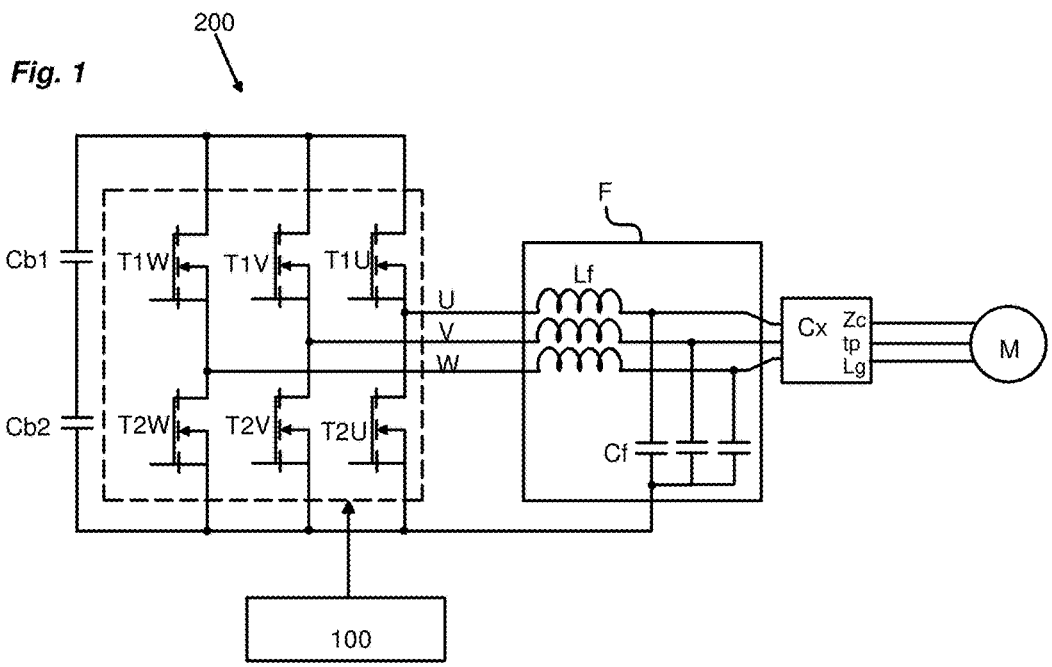
FIG. 1 shows a setup comprising an inverter-type converter connected to an electric machine, such as an electric motor.

The inverter 200 may have two or three output phases U, V, W over which the electric machine is connected. In FIG. 1, the inverter 200 is shown with three output phases.

The inverter 200 includes a plurality of switching arms that are connected in parallel between the two power supply lines of the bus.

The inverter 200 may have two voltage levels or more than two voltage levels.

In an inverter with two voltage levels, each switching arm includes two power switches T1U, T2U, T1V, T2V, T1W, T2W. A distinct output phase is connected to the midpoint located between the two switches.

With two voltage levels, each switching arm may deliver a voltage equal to 0 or a voltage equal to E.

Nonlimitingly, the power switches may be IGBT, MOSFET or JFET transistors.

The output phases of the inverter 200 are each connected to a distinct conductor of a cable Cx that is intended to connect the output of the inverter to the electric machine M. This cable Cx may in particular have a length Lg of several metres. It includes particular characteristics, in particular a length Lg, a characteristic impedance Zc and a propagation time $t_p$.

It is recalled that in a cable, an input impedance Zi is defined which characterizes the frequency signature of the cable and the characteristic impedance Zc of the cable, which is independent of the length thereof. This impedance is defined by the following expression:

$$Zc = \sqrt{\frac{Lc}{Cc}}$$

where LC is the inductance of the cable for a given length and Cc is the capacitance of the cable between two phases for the same given length.

For a time of less than 2*tp (propagation time of the cable), the impedance Zi is close to the impedance Zc.

The control setup includes a filter F connected to the output of the inverter 200. This filter is an LC filter and advantageously includes no damping resistor. For each output phase, the filter includes an inductor Lf (of inductance L) that is connected in series on the output phase and a capacitor Cf (of capacitance C) that is connected both to the inductor and to a power supply line of the bus.

The control setup also includes a control system 100 that is intended to generate the control commands to be applied to the power switches of the inverter 200 and to transmit said control commands to units for driving the power switches. The control system 100 includes at least one microprocessor and memory storage means.

As is conventional, the control system 100 is intended to generate control commands for the power switches of the switching arms.

Figure 2A:
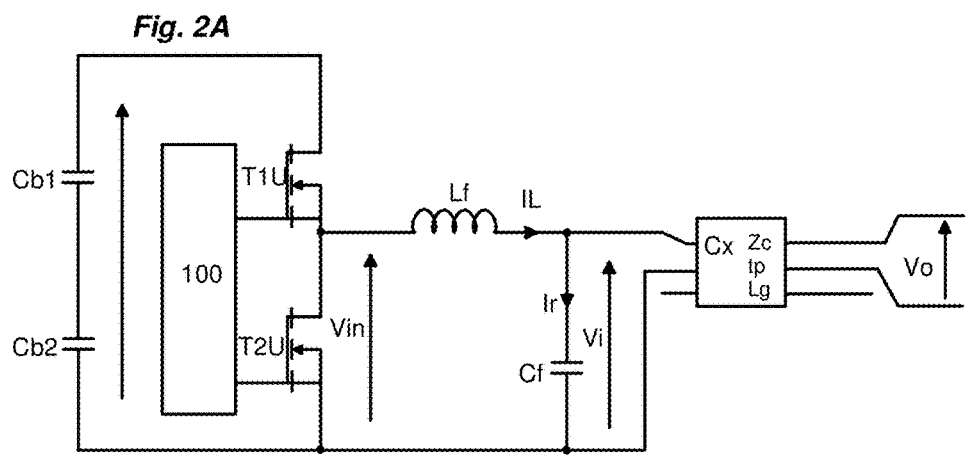
FIG. 2A shows, in a simplified manner, a single phase of the converter, which phase is connected to the electric machine.

To simplify, FIG. 2A shows a setup with a single phase connected to the electric machine M.

On each switching arm, the two switches are controlled in a complementary manner, i.e. when one of the switches is in the closed state, the other is in the open state and vice versa.

As the control is applied to a switching arm with two levels, the DC voltage is chopped between two voltage levels. A first voltage level is equal to 0 V and a second voltage level is equal to the DC voltage equal to E.

The controlling of a switching arm allows voltage pulses to be generated on the output phase that is connected thereto. A voltage pulse may be:

an increasing voltage pulse and include a rising vertical voltage edge between the value 0 V and the value E followed by a plateau of nonzero duration at the value E;

a decreasing voltage pulse and include a falling vertical voltage edge between the value E and the value 0 V followed by a plateau of nonzero duration at the value 0 V.

Each pulse is defined by a start time and by an end time, the duration separating the start time from the end time forming the width (d) of the pulse. It will be seen below that this width may vary from one pulse to the next.

Figure 3:
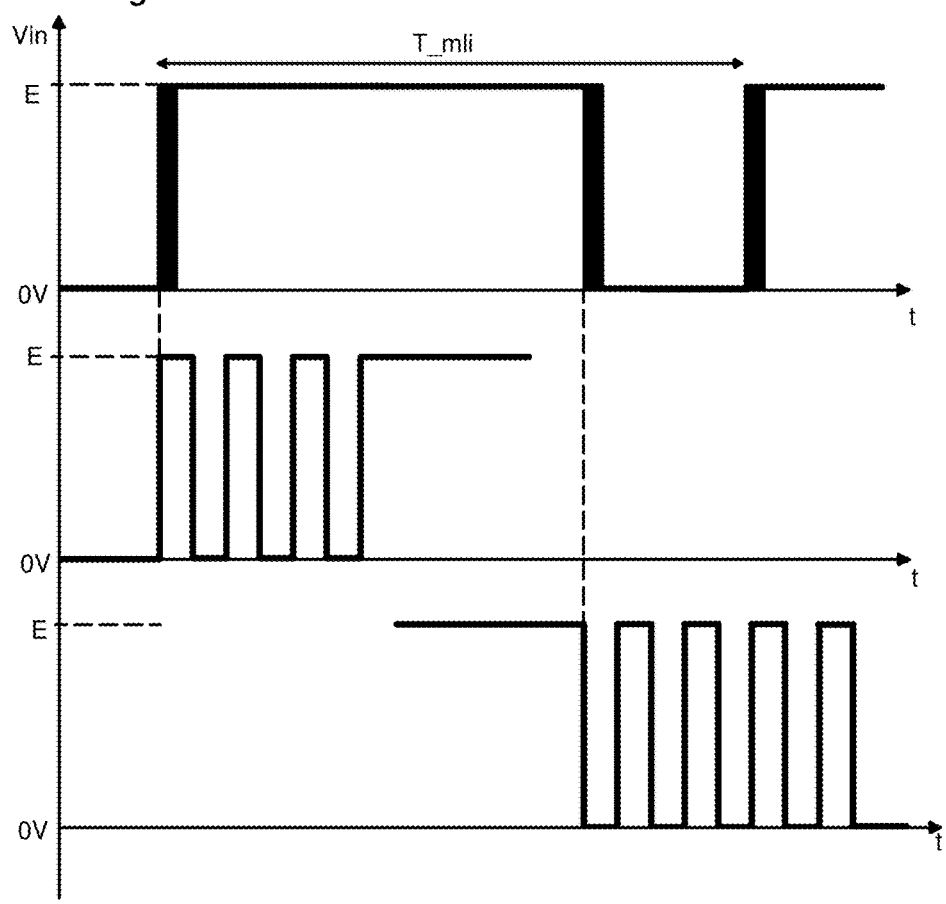
FIG. 3 schematically shows several diagrams illustrating the principle of the invention.

As is conventional, the control commands for the switches of an inverter 200 are generated by pulse-width modulation (PWM hereinafter). The control commands applied to the two switches of one and the same switching arm allow voltage pulses to be generated as output with a chopping period T_mli (FIG. 3).

With reference to FIG. 2A, the following quantities are defined:

E corresponds to the DC voltage delivered as input to the inverter 200;

Vin corresponds to the voltage delivered over each output phases of the inverter 200. This voltage is made up of successive voltage pulses obtained by complementarily switching the two power switches of the switching arm in questions;

Vi corresponds to the input voltage of the cable, downstream of the filter and hence across the terminals of the capacitor Cf of the filter;

Vo corresponds to the output voltage of the cable, i.e. across the terminals of the electric machine M connected to the cable Cx. Between the input and the output of the cable, the cable may in particular have a certain length, which will influence the operation of the setup;

Ir corresponds to the resonant current flowing through the capacitor Cf of the filter F;

IL corresponds to the current flowing through the inductor Lf of the filter F.

With the use of an inverter having more than two levels, it is known that it is possible to substantially decrease the overvoltages across the terminals of the electric machine. A first pulse is generated at half-voltage (E/2) followed by another pulse of amplitude E/2 that is superposed over the first pulse (E/2→E) with a delay of twice the propagation time $t_p$ of the cable. This waveform is easily generated using an inverter having three voltage levels (0, E/2 and E).

The principle of the invention is based in particular on providing a sequence of pulses making it possible to approach this waveform of the voltage Vi in order to limit the overvoltage oscillations at the end of the cable Cx that is connected to the electric machine. It will be possible to apply the solution of the invention whatever the number of levels of the inverter, but it is easily understood that it is particularly advantageous for an inverter that can generate only two voltage levels.

To obtain a variation in the voltage Vi that follows a profile 0, E/2 and E, a sequence of successive pulses characterized by the following relation will be used:

$t_N = t_p + t_r/2$ where $t_N$ is the time defining an axis of symmetry of the sequence (see below), $t_p$ is the propagation time of the cable (known characteristic) and $t_r$ is the rise time of the voltage Vi to half-voltage (E/2).

According to one aspect of the invention, it is a question of optimizing the control applied to the inverter 200 with a view to achieving one or more of the following objectives:

minimizing the overvoltages and voltage oscillations across the terminals of the electric machine;

minimizing the losses in the converter, i.e. acting on the amplitude of the resonant current Ir each time a power switch is switched;

minimizing the variation (the dv/dt) in the voltage Vi at the input of the cable.

With reference to FIG. 3, the principle of the invention consists in particular in generating a sequence of a plurality of successive pulses on each switching transition of the two power switches of one and the same switching arm. On opening and on closing the power switches of the switching arm, a sequence of a plurality of successive pulses is generated, replacing each rising edge and each falling edge of the voltage pulses that are generated in each chopping period T_mli. The term "switching transition" is understood to mean that one of the two switches of the switching arm transitions from the open state to the closed state and that the other of the two switches of the switching arm transitions from the closed state to the open state (complementary control). The principle will be applied in the same way for an inverter having more than two levels.

Each sequence of pulses takes the form of a square wave signal including a plurality of successive pulses, i.e. an increasing pulse is followed by a decreasing pulse.

According to one particular aspect of the invention, the control system aims to determine the optimal sequence of pulses to be applied on each switching transition of the power switches of a switching arm, when chopping the voltage with the chopping period T_mli.

An optimal sequence of pulses determined by the system includes an optimal number of successive pulses and each pulse is characterized therein by a determined width that is also optimal with respect to the target objective.

The optimal sequence of pulses makes it possible to limit the overvoltages and the oscillations of the voltage Vo across the terminals of the electric machine during the transition.

Figure 4:
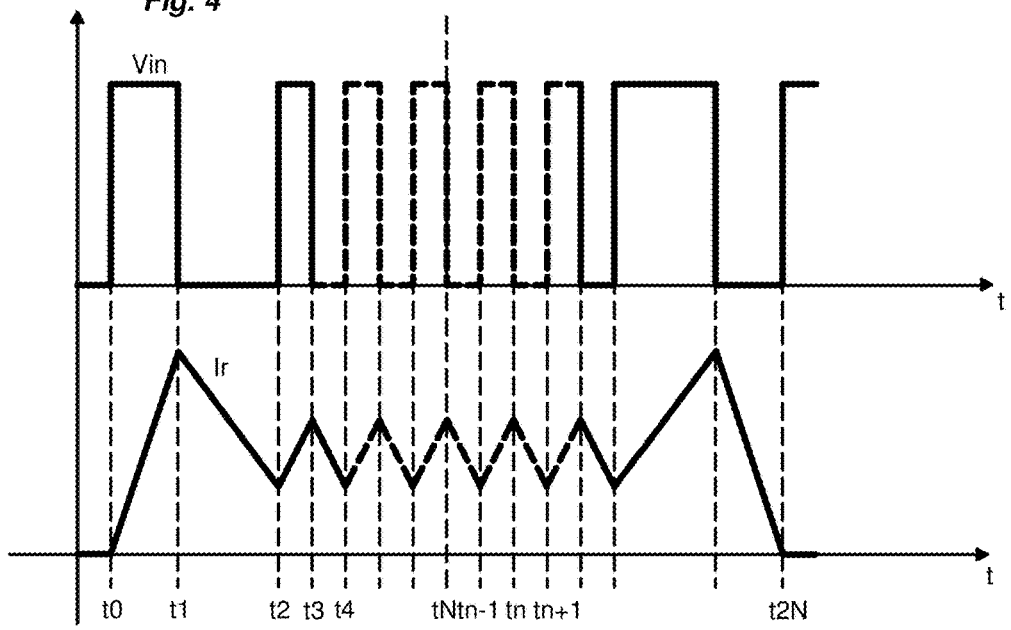
FIG. 4 schematically shows a diagram representing an optimal sequence of pulses in accordance with that generated in the invention.
Figure 5A:
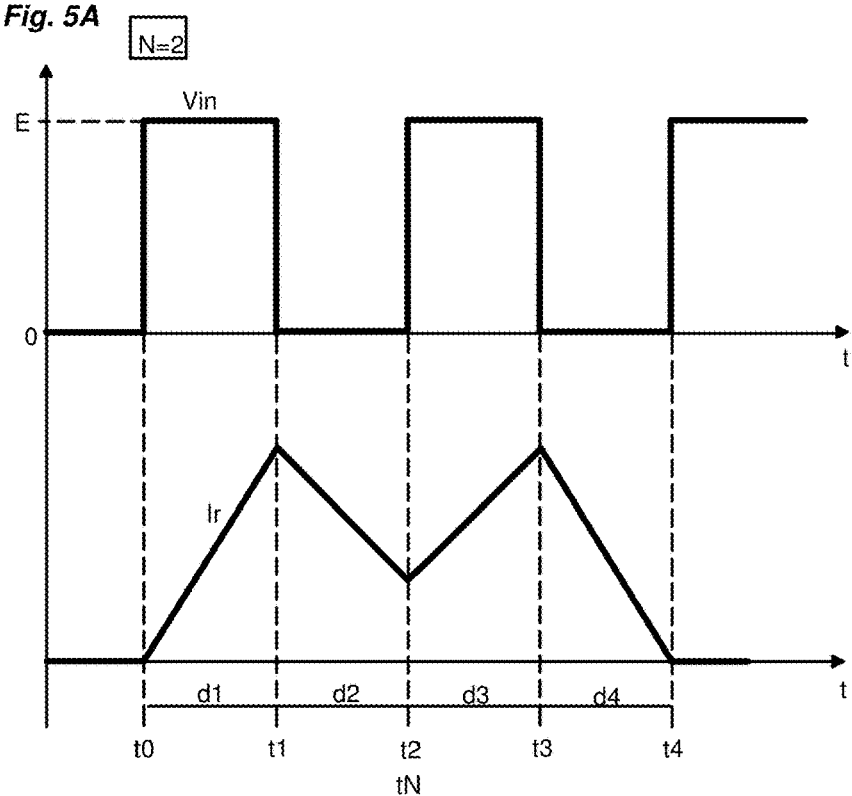
FIG. 5A to 5C schematically show several diagrams illustrating the principles of the invention.

With reference to FIG. 4, the optimal sequence of pulses thus includes the following general characteristics:

it includes a number 2N of successive pulses;

an increasing pulse is followed by a decreasing pulse and vice versa;

the pulses are each defined by a rank n, n ranging from 1 to 2N;

each pulse of rank n has a start time defined by $t_{n-1}$ and an end time defined by $t_n$; the pulse of rank 1 therefore has a start time defined by $t_0$ and an end time defined by $t_1$;

each pulse of rank n has a pulse width denoted by $d_n$; the pulse width $d_n$ of a pulse corresponds to the time elapsed between the time $t_{n-1}$ and the time $t_n$;

the width of a pulse of rank n is defined by the following relations:

$$d_n = \frac{\theta_n}{2\pi \cdot Fres} \qquad (1)$$

where:

$\theta_n$ defines the conduction angle of rank n. The value of this angle depends on the number of pulses in the sequence and on the applied sequence of pulses. For example, for the sequence defined by FIG. 5B and N equal to 2, the conduction angles are equal to:

$$\theta_1 = 0.506 \text{ rd}, \theta_2 = 1.318 \text{ rd}, \theta_3 = 1.318 \text{ rd}, \theta_4 = 0.506 \text{ rd} \quad (1)$$

and for the sequence defined by FIG. 5A and N equal to 2, the conduction angles will be equal to one another.

$$\theta_1 = \theta_2 = \theta_3 = \theta_4 = \frac{\pi}{T} \text{rd}$$

Figure 2B:
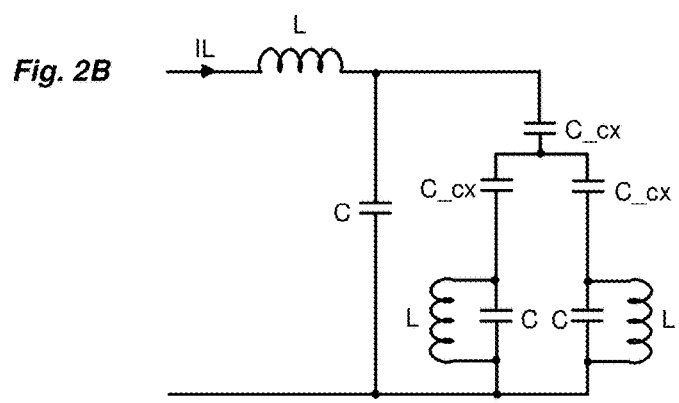
FIG. 2B shows an equivalent circuit diagram.

Fres corresponds to the first resonant frequency of the filter associated with the impedance Zi of the cable according to FIG. 2B.

The frequency Fres is the resonant frequency of the LC filter associated with the cable. A first approach is to determine Fres using the equivalent circuit of FIG. 2B. This equivalent circuit shows the configuration of an operation of switching one phase, the two other phases of the converter being connected by means of the bus. The three capacitors denoted by the reference C_cx represent the total capacitance of the cable between each phase, the equivalent inductances of the filter each take the value L and the equivalent capacitances of the filter take the value C.

The times $t_1$ and $t_2$ ... $t_n$ are determined relative to the widths of the pulses and are deduced from the relation below. The time $t_0$ is the start of the sequence.

$$t_n = t_{n-1} + d_n \quad (2)$$

the widths of the pulses are all determined independently;
the time $t_N$ corresponds to the medium time of the sequence;
in one and the same sequence, corresponding to each (increasing or decreasing) pulse of rank n is a (respectively decreasing or increasing) pulse that is symmetrical in terms of amplitude and in terms of duration and is defined by a rank equal to 2N+1−n; the time $t_N$ thus forms an axis of symmetry between the pulses located upstream and the pulses located downstream;
the sequence includes the same number of increasing pulses and decreasing pulses.

To determine the optimal sequence of pulses, the control system 100 applies an algorithm making it possible to determine both the number of pulses in the sequence and the width of each pulse.

The algorithm run by the system 100 is based in particular on an objective to be achieved.

Nonlimitingly, the target objective may be chosen from:
minimizing the overvoltages and the oscillations across the terminals of the electric machine, which may be expressed by the following relation:

$$\text{Int}_{Vo} = \lim_{T \to \infty} \frac{1}{T} \int_0^T (Vo(L, C, Zc, t_p, t_1, t_2, t_3, \ldots t_{2N}))^2 dt \to \min \quad (3)$$

where:
$\text{Int}_{Vo}$ corresponds to the integral of the voltage Vo across the terminals of the electric machine;
minimizing the losses in the converter, i.e. acting on the amplitude of the resonant current (Ir) each tine the transistor is switched (Irsw). This objective may be expressed by the following relation:

$$\text{Int}_{IrSW} = (E \cdot F_{SW} \cdot E_{SW}) \cdot \quad (4)$$
$$\sum_0^N (Irsw(E, L, C, Zc, t_p, t_0, t_1, t_2, t_3, \ldots t_{2N})) \to \min$$

where:
$\text{Int}_{Irsw}$ corresponds to the integral of the losses by switching generated each time a switch is switched.
minimizing the ground current, i.e. minimizing the dv/dt of the voltage Vi. This objective may be expressed by the following relation:

$$\text{Int}_{dv/dt} = \sum_0^N \frac{dVi}{dt}((E, L, C, Zc, t_1, t_2, t_3, \ldots t_{2N})) \to \min \quad (5)$$

where:
$\text{Int}_{dv/dt}$ corresponds to the integral of the variation in the voltage Vi at the input of the cable.

Advantageously, the pursued objective consists in minimizing the overvoltages and the oscillations across the terminals of the electric machine. This objective will be defined by a threshold value, denoted by T_OverV, below which the overvoltage level will have to be located for the sequence to be considered valid.

Figure 7:
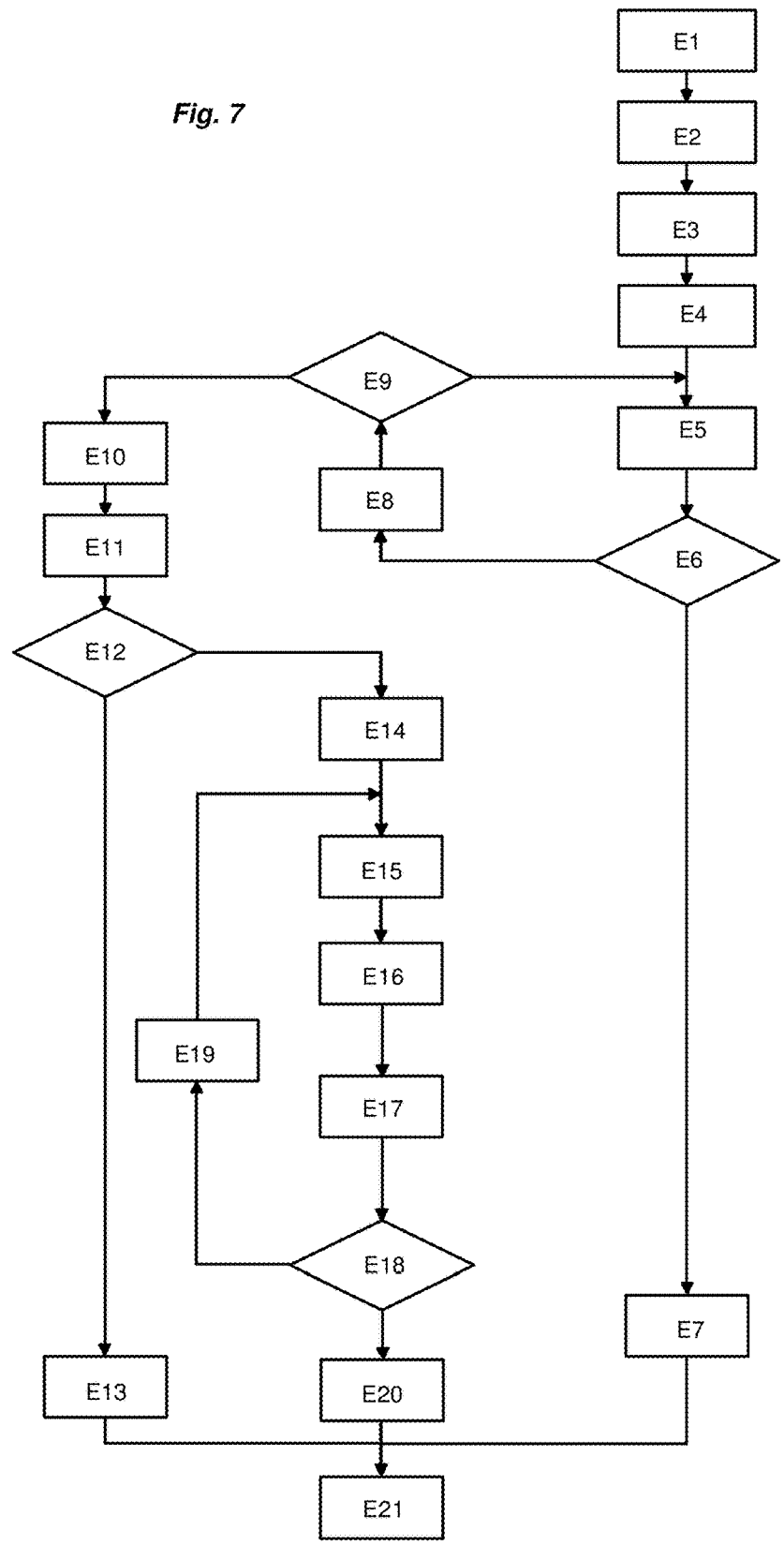
FIG. 7 illustrates an example of the algorithm run in order to determine the optimal sequence of pulses.

Nonlimitingly, the algorithm run is for example shown schematically in FIG. 7. This algorithm is described below by using the example of a main objective of decreasing the overvoltages across the terminals of the electric machine when applying a sequence of a plurality of successive pulses during each switching transition on a switching arm of the inverter. The target objective is thus defined by the relation (3) already defined above:

$$\text{Int}_{Vo} = \lim_{T \to \infty} \frac{1}{T} \int_0^T (Vo(L, C, Zc, t_p, t_1, t_2, t_3, \ldots t_{2N}))^2 dt \to \min$$

where:
$\text{Int}_{Vo}$ corresponds to the integral of the voltage Vo across the terminals of the electric machine.

This expression defines an overvoltage level, denoted by OverV, such that:

$$\text{OverV} = \text{Int}_{Vo} \quad (6)$$

It should be noted that the algorithm would have an equivalent structure if the target objective were different and choses form one of the two other objectives defined above.

To run the algorithm, the control system includes at least one control unit comprising a microprocessor and memory storage means.

According to one particular aspect of the invention, the relation (3) above is used to determine the switching times $t_1, t_2 t_3 \ldots t_{2N}$ of the sequence.

More precisely, the switching times are determined by satisfying the constraint set by equation (3). To achieve this, the below argument is applied by starting in particular with the transfer function of the cable between the voltage Vi and the voltage Vo. The cable can be modelled by the parameter Zi(stp), which is the input impedance of the cable, and by T2(stp), which is the transfer function of the cable, both expressed as Laplace transforms.

$$Zi(stp) = \frac{Zc}{\tanh(stp)}$$

$$T2(stp) = \frac{2s^{-stp}}{1+s^{-stp}}$$

The Laplace, transfer function f(s) of a function f(t) is defined:

$$f(s) = \int_{n}^{\infty} e^{-xt} \cdot f(t)dt$$

where s is the operator of the Laplace transform and t is time.

The variation of Vo with the input voltage Vin in the Laplace domain is deduced:

$$Vo(s) = Vin(s) \cdot \frac{1}{\cosh(stp)\left(x^3 LC + sL\frac{\tanh(stp)}{Zc} + 1\right)}$$

The voltage Vin is decomposed into 2N voltage steps (stepn) of amplitude 1 and −1, the sign of the amplitude being superscripted by the rank n, switching time.

$$Vin(t) = E \cdot \Sigma_{n=0}^{n=2N} \text{step}(t-t_n) \cdot (-1)^n$$

To satisfy the minimum overvoltage ripple, the value $\text{Int}_{Vo}$, defined by equation (3), is minimized:

$$\text{Int}_{Vo} = \lim_{T \to \infty} \frac{1}{T} \int_0^T (Vo(L, C, Zc, t_p, t_1, t_2, t_3, \ldots t_{2N}))^2 dt \to \min$$

$$\text{Int}_{Vo} = \lim_{T \to \infty} \frac{1}{T} E \int_0^T \left[\sum_{n=0}^{n=2N} \text{step}(t-t_n) \cdot (-1)^n \cdot h(t-t_n)\right]^2 dt$$

The term h(t) is the inverse function of the Laplace transform of G(s).

$$h(t) = \frac{1}{2\pi j} \int_{n-j\infty}^{n+j\infty} e^{st} \cdot G(s) ds$$

G(s) is defined by the equation below, which is the transfer function seen by the output of the inverter.

$$G(s) = \frac{1}{\cosh(stp)\left(s^2 LC + sL\frac{\tanh(stp)}{Zc} + 1\right)}$$

A necessary condition for minimizing $\text{Int}_{Vo}$, and hence the voltage oscillations, is that the system of equations is satisfied with 2N variables.

$$\frac{\partial \text{Int}_{Vo}}{\partial tn} = 0, n \in 1 \text{à} 2N$$

$$\frac{\partial \text{Int}_{Vo}}{\partial tn} = \frac{\partial}{\partial tn}\left[\lim_{t \to \infty} \frac{1}{T} E \int_0^T \left[\sum_{n=0}^{n=2N} \text{step}(t-t_n) \cdot (-1)^n \cdot h(t-t_n)\right]^2 dt\right] = 0$$

Thus, for N=3:
by virtue of the symmetry of the pulses, the times $t_n$ are related to one another by the following relations:

$$t_3 = t_N, \ t_6 = 2t_N, \ t_5 = 2t_N - t_1, \ t_4 = 2t_N - t_2$$

The system may be simplified to three equations by these relations above, $$\frac{\partial \text{Int}_{Vo}}{\partial t_1} = 0, \ \frac{\partial \text{Int}_{Vo}}{\partial t_2} = 0, \ \frac{\partial \text{Int}_{Vo}}{\partial t_3} = 0$$

$t_1, t_2, t_3 \ldots t_{2N}$ are determined using the system of equations above (here with N=3).

Nonlimitingly, with reference to FIG. 7, the algorithm run by the control system includes the following steps:

Step E1

This first step consists in identifying the characteristics of the setup. These characteristics are in particular:
- the propagation time $t_p$ of the cable connecting the inverter to the machine;
- the characteristic impedance Zc of the cable;
- the inductance L of the inductor Lf of the filter;
- the capacitance C of the capacitor Cf of the filter;
- the DC voltage E delivered as input to the inverter 200.

By way of example, the identification operation may be implemented by inputting the various parameters or by means of automatic recognition, for example in a learning step implemented when starting up the setup.

Step E2

This is a question of recording an overvoltage threshold value T_OverV that is acceptable for the electric machine M. By way of example, this threshold value T_OverV may be entered using a suitable interface.

Step E3

This marks the start of determining the sequence of pulses. To do this, the algorithm arbitrarily starts with a number of pulses defined by N=2 (i.e. 2N pulses in total) and the sequence defined in FIG. 5B, minimizing the switching losses. It would be possible to start the sequence with a different number of pulses. In any case, the algorithm makes it possible to converge towards the sequence that includes an optimal number N with respect to the target objective.

Step E4

In this step, the system thus determines the time $t_1$ corresponding to the end time of the first pulse (n=1) and the time $t_2$ corresponding to the end time of the second pulse (n=2).

Figure 5B:
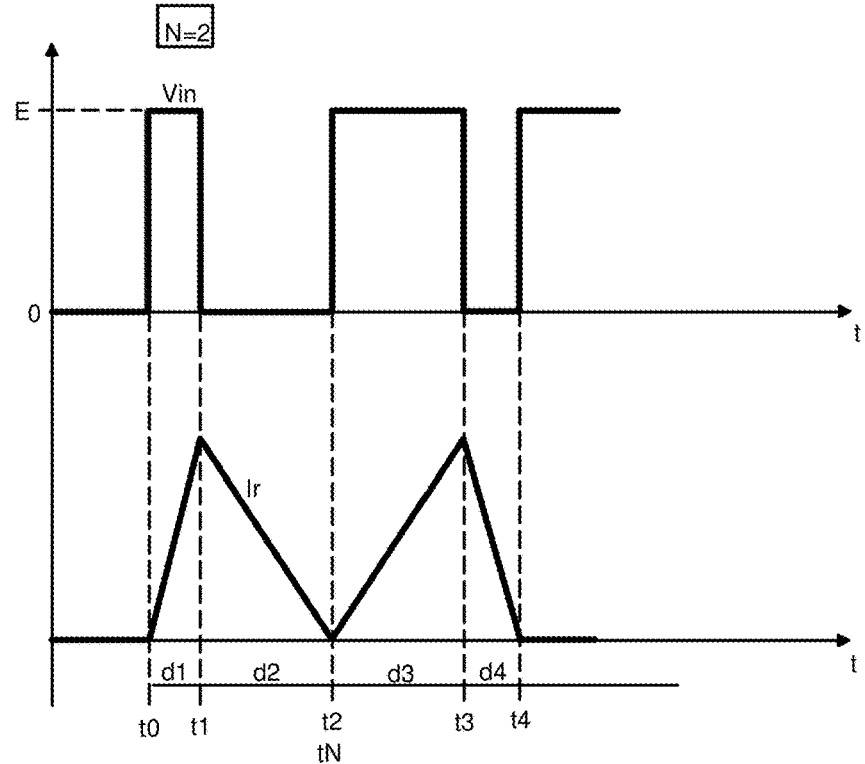

The width $d_n$ of a pulse is calculated on the basis of equation (1) reproduced below:

$$d_n = \frac{\theta_n}{2\pi \cdot Fres} \quad (1)$$

where $\theta_1 = 0.506$ rd, $\theta_2 = 1.318$ rd, $\theta_3 = 1.318$ rd, $\theta_4 = 0.506$ rd, relative to FIG. 5B.

The times $t_1$ and $t_2 \ldots t_n$ are determined relative to the widths of the pulses and deduced from relation (2) reproduced below, The time $t_0$ is the start of the sequence.

$$t_n = t_{n-1} + d_n \quad (2)$$

The pulses of rank 3 and 4 are symmetrical in terms of amplitude and in terms of duration with respect to the pulses of rank 2 and of rank 1, respectively (according to the following relation (7):

$$d_n - d_{2N+1-n})$$

Step E5

On the basis of the preceding data, it is then a question of theoretically determining the overvoltage level OverV that would be generated by the previously established pulse sequence. The overvoltage level OverV is given by relation (6) above.

Step E6

This is a comparison step for the purpose of determining whether the overvoltage value OverV determined in step E5 is lower than or equal to a threshold value T_OverV, which is prestored in the system memory.

Step E7

If the overvoltage value OverV is lower than or equal to the threshold voltage T_OverV then the sequence of pulses is considered valid and the sequence may be finalized by determining the width of each pulse, in particular those of the symmetrical pulses, using the relation below:

$$d_n = d_{2N+1-n}$$

Step E8

If the overvoltage value OverV is higher than the threshold value T_OverV then the width of the pulses is acted upon. Arbitrarily, the width of the pulse of rank 1 is increased and the width of the pulse of rank 2 is decreased. The time $t_1$ is shifted by a determined value (for example equal to $t_p/100$) in order to increase the width of the pulse of rank 1 and the time $t_2$ is shifted by the same value ($t_p/100$) in order to decrease the width of the pulse of rank 2.

Step E9

This is a test step for determining whether the two pulses of rank 1 and of rank 2 could be combined into a single pulse. To do this, the test consists in determining whether $t_2 = t_1$.

If the time $t_2$ is not merged with $t_1$, the method returns to step E5 defined above in order to optimize the width of the pulses for N=2 until reaching an acceptable overvoltage level.

Step E10

Following step E9, if the time $t_2$ is merged with the time $t_1$, the system examines the situation for N=1.

Step E11

This is a question of determining the overvoltage level OverV that could occur for N=1, the pulse of rank 1 having a width defined by the time $t_1$ determined above.

Step E12

This is a new test carried out on the overvoltage level OverV calculated in the preceding step with respect to the prestored threshold value T_OverV.

Step E13

If the overvoltage level OverV is lower than or equal to the threshold value T_OverV, the sequence of pulses with N=1 is validated, with the pulse of rank 1 defined by the time $t_1$.

Step E14

If the overvoltage level OverV is higher than the threshold value T_OverV, then the system concludes that a number of pulses in the sequence has to be increased.

The system therefore sets the number N to 3.

Step E15

The system runs a loop in order to determine the appropriate number of pulses. The loop first consists in determining the times $t_1$, $t_2$ to $t_N$, and hence a sequence of pulses, allowing the determined objective to be achieved.

Nonlimitingly, the target objective is:
to minimize the overvoltages and the oscillations across the terminals of the motor, which may be expressed by the following relation (3):

$$\mathrm{Int}_{V_O} = \lim_{T \to \infty} \frac{1}{T} \int_0^T (V_O(L, C, Z_C, t_p, t_1, t_2, t_3, \ldots t_{2N}))^2 dt \to \min$$

where:

$\mathrm{Int}_{V_O}$ corresponds to the integral of the voltage Vo across the terminals of the electric machine.

The system determines each time $t_n$ in a pulse sequence (i.e. the times $t_1$, $t_2$, $t_3$ (equal to $t_N$ when N=3)) allowing the target objective to be achieved, i.e. that of obtaining a minimal overvoltage level.

Step E16

The system next determines the duration $t_r$. This duration $t_r$ corresponds to the time taken by the voltage Vi at the input of the cable to reach the value E/2. In the case of a three-phase converter, the voltage Vi corresponds to the composite voltage between two phases. This duration $t_r$ is dependent on the elements of the LC filter and on the characteristic impedance Zc of the cable, as well as on the widths of the pulses $d_1$ to $d_N$ that are determined on the basis of the times calculated in step E17 above. Thus:

$$t_r = f(L, C, Z_c, d_1, d_2 \ldots d_N) \tag{8}$$

where:

$$d_n = t_n - t_{n-1}$$

It should be noted that the data calculated for the sequence must in all cases satisfy the following two relations:

$$t_N = t_p + t_r/2 \tag{9}$$

and $$t_r < 2t_p \tag{10}$$

The sequence defined by a number N of increasing pulses and N decreasing pulses is optimized if this equation (9) is satisfied, i.e. if the voltage Vo is close to E/2 at the time $t_N$.

In defining $t_N$, the duration of the sequence ($2 \ast t_N$) is defined. Optionally, it is also possible to determine the slope of the variation in the voltage Vi (dv/dt) with time by means of the following relation:

$$\frac{dv}{dt} = \frac{E}{2 \cdot t_r}$$

Step E17

This is a question of determining the overvoltage level OverV that could occur for the sequence of pulses defined by N (N at least equal to 3 in the first loop).

Step E18

Once the sequence has been constructed, it is a question of verifying that the level of overvoltages generated is satisfactory. This step therefore consists in verifying that the overvoltage level obtained by virtue of the sequence is lower than or equal to the threshold value T_OverV.

Step E19

If the obtained level of overvoltages OverV is still higher than the threshold value T_OverV, a new sequence has to be calculated. This new sequence will be generated by incrementing the value of N by one unit (N=N+1). As long as the condition for the obtained level of overvoltages remains unmet, a new sequence will be calculated by increasing the number of pulses defined by N by one unit on each loop.

Step E20

If the level of overvoltages OverV determined on the basis of the last sequence that was generated is lower than or equal to the threshold value T_OverV, the system may finalize the sequence by determining the width $d_n$ of each pulse in the sequence using the following relation:

$$d_n = t_n - t_{n-1}$$

and by taking the following relation into account in order to ensure symmetry with respect to the time $t_N$:

$$d_n = d_{2n+1-n}$$

Step E21

This step is the end of the algorithm. In this step, the system has determined the optimal sequence of pulses allowing the target objective to be achieved in step E17.

Figure 5C:
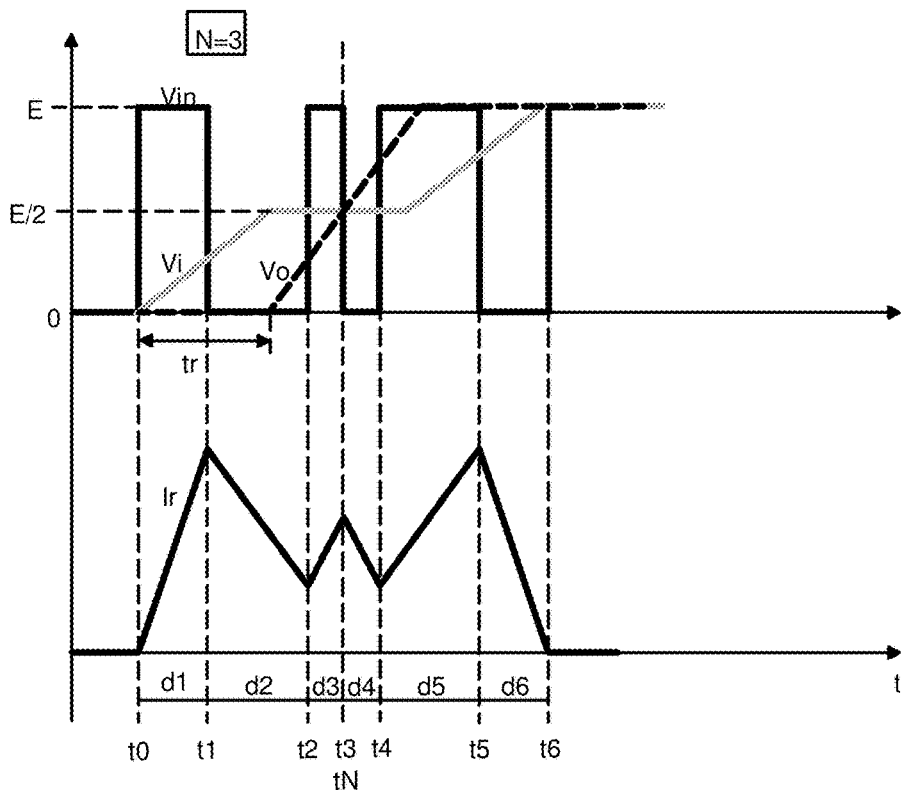

FIGS. 5A to 5C show various diagrams allowing the principle of the invention to be better understood.

FIG. 5A shows a sequence of pulses with N=2 in which all of the pulses are of the same width. In this sequence, the resonant current Ir remains the same from the start of the sequence to the end of the sequence, which is one of the target objectives of the sequence. However, the sequence of pulses is not optimal because the resonant current Ir at the switching transition is not zero, resulting in switching losses.

In FIG. 5B, the applied sequence is optimized with respect to the preceding one because the resonant current is zero at the time of each switching transition. This is possible because the width of the pulses in the sequence is optimized according to the objective of decreasing the switching losses defined by relation (4) above.

In FIG. 5C, the proposed sequence of pulses makes it possible to minimize the overvoltages across the terminals of the electric machine during each switching transition on a switching arm. The rise time taken by the voltage Vi at the input of the cable to reach the value E/2 defines the duration $t_r$. Furthermore, the particularity of this sequence is that the voltage Vo (dashed line) across the terminals of the machine M is close to the value E/2 at the time $t_N$, defining the symmetry of the sequence.

Figure 6:
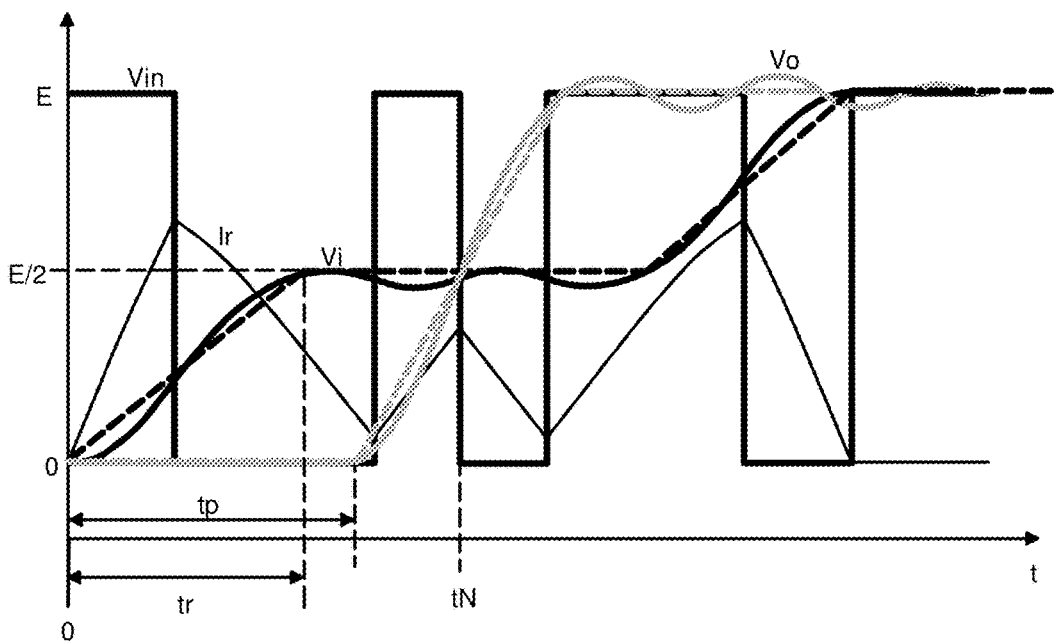
FIG. 6 shows an operating simulation of the principle of the invention.

FIG. 6 shows a simulation making it possible to demonstrate that the overvoltage effect is attenuated when the sequence of pulses that is applied is optimized. The obtained voltage Vo and voltage Vi curves each have a mean (dashed line) that is close to the ideal solution.

It is apparent from the above that the control method of the invention and the system used for the implementation thereof have a certain number of advantages, including:

they make it possible to determine a sequence of pulses that is optimal with respect to the target objective, regardless of the sizing of the filter F;

they allow the overvoltages across the terminals of the electric machine during switching operations to be limited as much as is possible, even if the inverter used is a two-level inverter.

The invention claimed is:

1. Method for controlling a converter connected to an electric machine by a cable (Cx) via a filter (F), said cable (Cx) comprising at least two conductors and exhibiting an impedance and said filter being an LC filter and comprising at least one inductor (Lf) and one capacitor (Cf) for each conductor of the cable, said converter comprising at least two switching arms each comprising at least two power switches that are switched so as to chop a DC voltage having a value E in order to deliver at least two voltage levels, the controlling of a switching arm making it possible to generate voltage pulses on the output phase that is connected thereto, a voltage pulse potentially being an increasing voltage pulse and including a rising vertical voltage edge or being a decreasing voltage pulse and including a falling vertical voltage edge, said method being characterized in that it consists in determining at least one sequence of a plurality of voltage pulses forming a square wave signal to be applied to each conductor on each switching, transition of the two power switches of one and the same switching arm so as to minimize an overvoltage level across the terminals of the electric machine (M), said sequence comprising a number 2N of successive pulses, N being greater than or equal to 1, each pulse being defined by a distinct rank n, said sequence being generated such that each increasing voltage pulse of rank n exhibits a pulse width that is identical to that of a decreasing voltage pulse of rank equal to 2N+1−n, and in that it includes the following steps:

determining the number of successive pulses of said sequence;

determining the width of each pulse of the sequence made suitable for minimizing the overvoltage level across the terminals of the electric machine (M) while satisfying the following relation:

$$t_N = t_p + t_r/2$$

where:

$t_N$ corresponds to an instant in time of the end of the pulse of rank N;

$t_p$ corresponds to the propagation time of the cable;

$t_r$ corresponds to the rise time for the voltage (Vi) present at the input of the cable to reach 50% of said value E of the DC voltage.

2. Method according to claim 1, characterized in that it includes a step of determining the overvoltage level on the basis of the following relation:

$$Int_{Vo} = \lim_{T \to \infty} \frac{1}{T} \int_0^T (Vo(L, C, Zc, t_p, t_1, t_2, t_3, \ldots t_{2N}))^2 dt$$

where:

$Int_{Vo}$ corresponds to said overvoltage level resulting from calculating the integral of the voltage Vo across the terminals of the electric machine;

L corresponds to the inductance of the inductor of the filter;

C corresponds to the capacitance of the capacitor of the filter;

Zc corresponds to the characteristic impedance of the cable.

3. Method according to claim 2, characterized in that it includes at least one step of comparing the overvoltage level determined for said pulse sequence with a threshold value.

4. Method according to claim 3, characterized in that it includes a step of increasing the number of pulses in the sequence for as long as the obtained overvoltage level exceeds said threshold value.

5. Method according to claim 1, characterized in that it includes a step of determining the rise time for the voltage (Vi) at the input of the cable to reach 50% of said value E of the DC voltage on the basis of the following relation:

$$t_r = f(L, C, Zc, d_1, d_2 \ldots d_N)$$

where:

L corresponds to the inductance of the inductor of the filter;

C corresponds to the capacitance of the capacitor the filter;

Zc corresponds to the characteristic impedance of the cable;

$d_1, d_2 \ldots d_N$ correspond to the width of each pulse of rank n of said sequence of pulses.

6. Method according to claim 2, characterized in that it includes a step of entering or of identifying the following parameters:

L, corresponding to the inductance of the inductor of the filter;

C, corresponding to the capacitance of the capacitor of the filter;

Zc, corresponding to the characteristic impedance of the cable;

tp, corresponding to the propagation time of the cable.

7. System for controlling a converter connected to an electric machine by a cable (Cx) via a filter (F), said cable (Cx) comprising at least two conductors and exhibiting an impedance and said filter being an LC filter and comprising at least one inductor (Lf) and one capacitor (Cf) for each conductor of the cable, said converter comprising at least two switching arms each comprising at least two power switches that are switched so as to chop a DC voltage having a value E in order to deliver at least two voltage levels, the controlling of a switching arm making it possible to generate voltage pulses on the output phase that is connected thereto, a voltage pulse potentially being an increasing voltage pulse and including a rising vertical voltage edge or being a decreasing voltage pulse and including a falling vertical voltage edge, said system being characterized in that it is suitable for determining at least one sequence of a plurality of voltage pulses forming a square wave signal to be applied to each conductor on each switching transition of the two power switches of one and the same switching arm so as to minimize an overvoltage level across the terminals of the electric machine (M), said sequence comprising a number 2N of successive pulses, N being greater than or equal to 1, each pulse being defined by a distinct rank n, said sequence being generated such that each increasing voltage pulse of rank n exhibits a pulse width that is identical to that of a decreasing voltage pulse of rank equal to 2N+1−n, and in that it is, also suitable for:

determining the number of successive pulses of said sequence;

determining the width of each pulse of the sequence made suitable for minimizing the overvoltage level across the terminals of the electric machine (M) while satisfying the following relation:

$$t_N = t_p + t_r/2$$

where:

$t_N$ corresponds to an instant in time of the end of the pulse of rank N;

$t_p$ corresponds to the propagation time of the cable;

$t_r$ corresponds to the rise time for the voltage (Vi) present at the input of the cable to reach 50% of said value E of the DC voltage.

8. System according to claim 7, characterized in that it is suitable for determining an overvoltage level on the basis of the following relation:

$$\text{Int}_{Vo} = \lim_{T \to \infty} \frac{1}{T} \int_0^T (Vo(L, C, Zc, t_p, t_1, t_2, t_3, \ldots t_{2N}))^2 dt$$

where:

$\text{Int}_{Vo}$ corresponds to said overvoltage level resulting from calculating the integral of the voltage Vo across the terminals of the electric machine;

L corresponds to the inductance of the inductor of the filter;

C corresponds to the capacitance of the capacitor of the filter;

Zc corresponds to the characteristic impedance of the cable.

9. System according to claim 8, characterized in that it is suitable for comparing said overvoltage level determined for said pulse sequence with a threshold value.

10. System according to claim 9, characterized in that it is suitable for increasing the number of pulses in the sequence for as long as the obtained overvoltage level exceeds said threshold value.

11. System according to claim 7, characterized in that it is suitable for determining the rise time for the voltage (Vi) at the input of the cable to reach 50% of said value E of the DC voltage on the basis of the following relation:

$$t_r = f(L, C, Zc, d_1, d_2 \ldots d_N)$$

where:

L corresponds to the inductance of the inductor of the filter;

C corresponds to the capacitance of the capacitor of the filter;

Zc corresponds to the characteristic impedance of the cable;

$d_1, d_2 \ldots d_N$ correspond to the width of each pulse of rank n of said sequence of pulses.

12. System according to claim 8, characterized in that it includes a module for entering or for identifying the following parameters:

L, corresponding to the inductance of the inductor of the filter;

C, corresponding to the capacitance of the capacitor of the filter;

Zc, corresponding to the characteristic impedance of the cable;

tp, corresponding to the propagation time of the cable.

* * * * *